(12) United States Patent
Petrick et al.

(10) Patent No.: US 8,752,848 B2
(45) Date of Patent: Jun. 17, 2014

(54) COMPUTER CART

(75) Inventors: Christopher Petrick, Park Ridge, IL (US); Matthew Petrick, Oak Park, IL (US); Chris Brandel, Chicago, IL (US)

(73) Assignee: Bretford Manufacturing, Inc., Franklin Park, IL (US)

( * ) Notice: Subject to any disclaimer, the term of this patent is extended or adjusted under 35 U.S.C. 154(b) by 617 days.

(21) Appl. No.: 13/017,123

(22) Filed: Jan. 31, 2011

(65) Prior Publication Data

US 2011/0309591 A1    Dec. 22, 2011

Related U.S. Application Data

(60) Provisional application No. 61/355,623, filed on Jun. 17, 2010.

(51) Int. Cl.
*B62B 3/00*    (2006.01)

(52) U.S. Cl.
USPC ...................................... 280/47.35; 280/79.3

(58) Field of Classification Search
USPC ...................... 280/47.34, 47.35, 79.11, 79.3; 361/724–727; 174/72 A, 72 R, 95–97, 174/101; 211/26
See application file for complete search history.

(56) References Cited

U.S. PATENT DOCUMENTS

| | | | | |
|---|---|---|---|---|
| 4,160,880 A | * | 7/1979 | Brey | 439/571 |
| 5,023,404 A | * | 6/1991 | Hudson et al. | 174/97 |
| 6,008,621 A | * | 12/1999 | Madison et al. | 320/107 |
| 6,185,098 B1 | * | 2/2001 | Benavides | 361/695 |
| 6,218,796 B1 | * | 4/2001 | Kozlowski | 318/280 |
| 6,327,139 B1 | * | 12/2001 | Champion et al. | 361/608 |
| 6,336,691 B1 | * | 1/2002 | Maroney et al. | 312/236 |
| 6,539,161 B2 | * | 3/2003 | Holman et al. | 385/136 |
| 6,766,093 B2 | * | 7/2004 | McGrath et al. | 385/134 |
| 6,791,841 B1 | * | 9/2004 | Tirrell et al. | 361/724 |
| 6,803,519 B2 | * | 10/2004 | de la Borbolla et al. | 174/480 |
| 6,893,299 B2 | * | 5/2005 | Baker et al. | 439/719 |
| 6,940,731 B2 | * | 9/2005 | Davis et al. | 361/801 |
| 6,951,468 B1 | * | 10/2005 | Greco | 439/131 |
| 6,996,904 B1 | * | 2/2006 | Howell | 29/868 |
| 7,026,553 B2 | * | 4/2006 | Levesque et al. | 174/100 |
| 7,038,126 B2 | * | 5/2006 | Solet | 174/50 |
| 7,055,833 B2 | * | 6/2006 | Wixted et al. | 280/47.34 |
| 7,119,282 B2 | * | 10/2006 | Krietzman et al. | 174/101 |
| 7,130,190 B1 | * | 10/2006 | Baker | 361/695 |
| 7,160,113 B2 | * | 1/2007 | McConnell et al. | 434/365 |
| 7,178,679 B2 | * | 2/2007 | Canty et al. | 211/26 |
| 7,223,918 B2 | * | 5/2007 | Gelibert | 174/95 |
| 7,325,891 B1 | * | 2/2008 | Kinsley et al. | 312/257.1 |
| 7,447,036 B2 | * | 11/2008 | Soeda et al. | 361/724 |
| 7,510,421 B2 | * | 3/2009 | Fransen et al. | 439/449 |
| 7,595,995 B2 | * | 9/2009 | Hock | 361/727 |

(Continued)

OTHER PUBLICATIONS

Written Opinion of the International Searching Authority from corresponding PCT application PCT/US2011/027054.

*Primary Examiner* — Katy M Ebner
(74) *Attorney, Agent, or Firm* — Anderson Gorecki & Rouille LLP

(57) ABSTRACT

A computer cart has removable electrical connector management system which may be removed from the computer cart to install electrical connectors and then reinserted into the computer cart to facilitate wiring of the cart. A numbering system is implemented to uniquely identify corresponding electrical and physical characteristics of the cart to facilitate maintenance of computers stored within the cart.

8 Claims, 13 Drawing Sheets

(56) References Cited

U.S. PATENT DOCUMENTS

| | | | |
|---|---|---|---|
| 7,800,914 B2 * | 9/2010 | Dully | 361/756 |
| 7,939,763 B2 * | 5/2011 | Jones et al. | 174/101 |
| 7,952,027 B2 * | 5/2011 | Grelck | 174/72 A |
| 8,014,171 B2 * | 9/2011 | Kelly et al. | 361/826 |
| 8,066,242 B2 * | 11/2011 | Potter et al. | 248/300 |
| 8,084,992 B2 * | 12/2011 | Scheffy et al. | 320/114 |
| 8,093,499 B2 * | 1/2012 | Hoffer et al. | 174/72 A |
| 8,243,455 B1 * | 8/2012 | Raymond et al. | 361/727 |
| 8,273,989 B2 * | 9/2012 | Garza et al. | 174/100 |
| 8,320,110 B2 * | 11/2012 | Chen | 361/679.02 |
| 2008/0203968 A1 | 8/2008 | Campbell | |
| 2009/0016008 A1 | 1/2009 | Hock | |
| 2009/0096336 A1 * | 4/2009 | Petrick et al. | 312/237 |
| 2011/0193524 A1 * | 8/2011 | Hazzard et al. | 320/114 |

\* cited by examiner

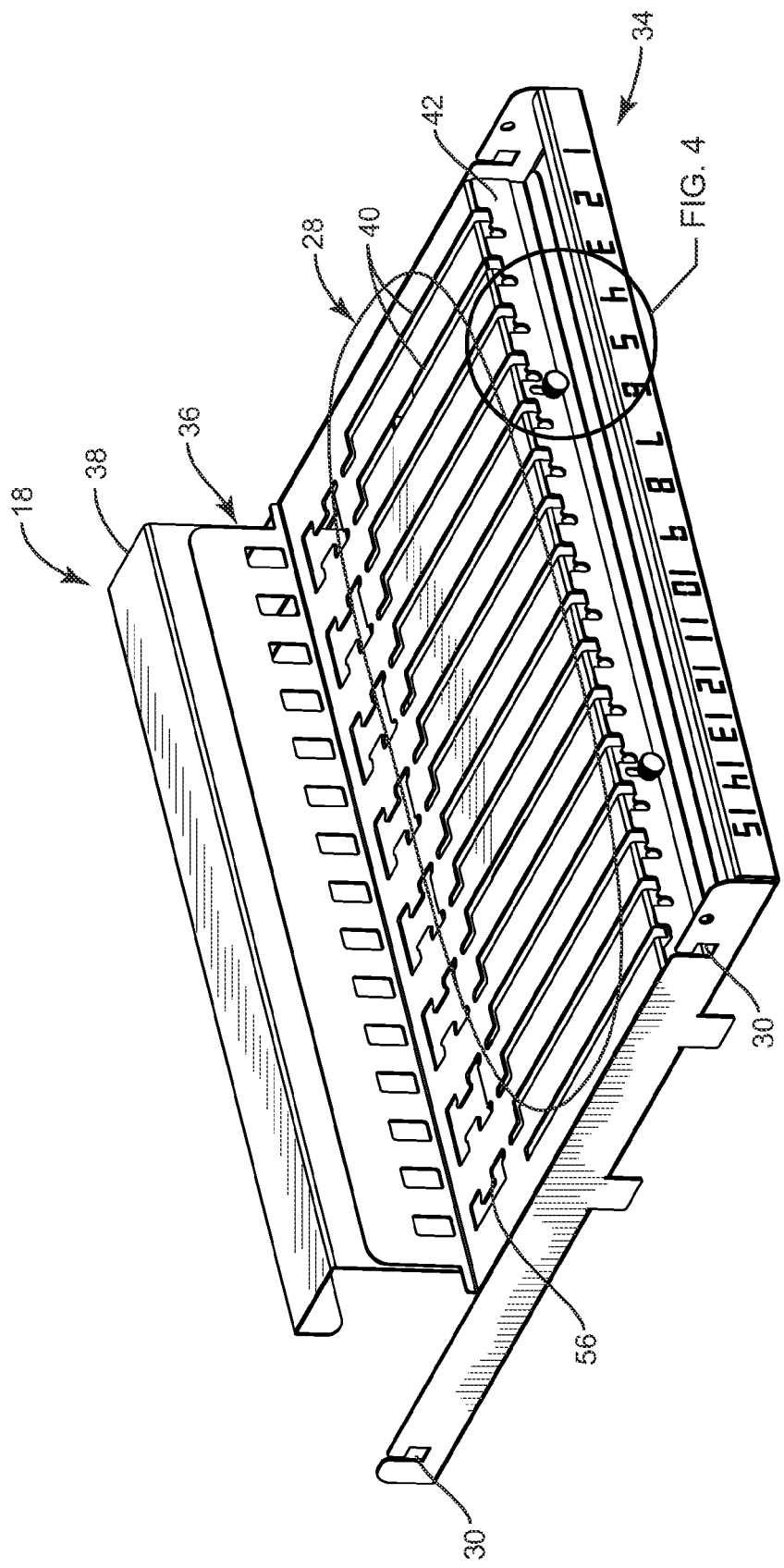

COMPUTER CART

CROSS-REFERENCE TO RELATED APPLICATIONS

This application claims priority to U.S. Provisional Patent Application No. 61/355,623, filed Jun. 17, 2010, entitled Computer Cart with Identified Bays and Cord Locks, the content of which is hereby incorporated herein by reference.

BACKGROUND OF THE INVENTION

1. Field of the Invention

The present invention relates to storage systems and, more particularly, to a cart designed to house and store portable computing devices.

2. Description of the Related Art

Portable computing devices, such as laptop computers, tablet computers, iPads™, iPods™, and other computing devices are commonly used in educational facilities to enrich the curriculum provided to students. Likewise, these types of devices are increasingly being used in other contexts, such as in museums, to enable people to interact with the exhibits present in the museum.

Portable computing devices typically include a battery that may be charged to enable the portable computing devices to be used while not connected to an electrical outlet. An electrical adapter is used to convert 120/240 volt 60/50 Hz AC electrical power available in a standard electrical outlet to a lower voltage (e.g. 19.5 volt or 24 volt) DC power which is then input to the portable computing devices to charge its battery. Computer carts have been developed which may be used to store portable computing devices in a secure manner. Often, the portable computing devices will be electrically connected within the cart to enable the portable computing devices to be charged and synchronized while stored in the cart.

To make it easy to remove portable computing devices from the computer cart and to return the portable computing devices to the cart, it is common for these electrical adapters to be stored in the cart so that the user is only required to manipulate the portable computing device itself. For example, if the computer cart includes individual storage bays, an electrical lead from a corresponding electrical adapter may be fed through into the individual storage bay so that it is easy for the computer to be plugged into an electrical adapter to be charged while stored within the cart. The charging cable is connected to the electrical adapter which is plugged into a power source within the cart so that the computers can be charged without requiring the computer users to have access to the electrical adapters.

Configuring a cart in this manner provides the users with easy access to computers, but requires significant labor to wire the cart. For example, if the cart is designed to hold 30 computers, a technician will need to install 30 electrical adapters and feed 30 connecter cables through and into the area of the cart where the computers will be stored. If one of the electrical adapters then fails, the technician will need to isolate the electrical adapter to determine which one of the adapters should be replaced. Accordingly, it would be advantageous to provide a new type of computer cart with improved assembly and maintenance capabilities.

SUMMARY OF THE INVENTION

The following Summary and the Abstract set forth at the end of this application are provided herein to introduce some concepts discussed in the Detailed Description below. The Summary and Abstract sections are not comprehensive and are not intended to delineate the scope of protectable subject matter which is set forth by the claims presented below.

A computer cart has removable electrical connector management system which may be removed from the computer cart to install electrical connectors and then reinserted into the computer cart to facilitate wiring of the cart. A numbering system is implemented to uniquely identify corresponding electrical and physical characteristics of the cart to facilitate maintenance of computers stored within the cart.

BRIEF DESCRIPTION OF THE DRAWINGS

Aspects of the present invention are illustrated by way of example in the following drawings in which like references indicate similar elements. The following drawings disclose various embodiments of the present invention for purposes of illustration only and are not intended to limit the scope of the invention. For purposes of clarity, not every component may be labeled in every figure. In the figures:

FIG. 3 is a front perspective view of an underside of a removable shelf from the computer cart of FIG. 1 showing an electrical connector management system;

DETAILED DESCRIPTION

Figure 1:
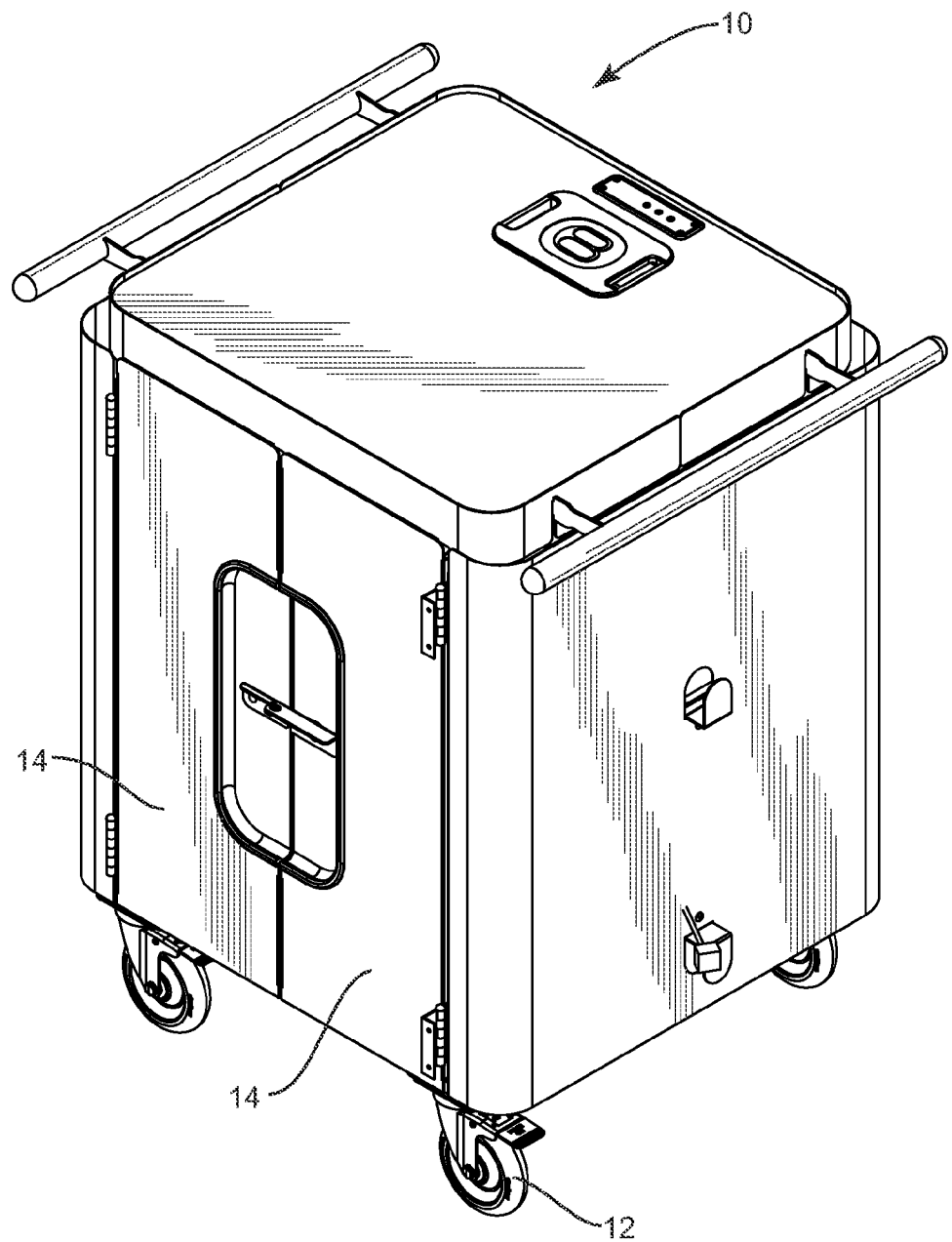
FIG. 1 is a front perspective view of a computer cart according to an embodiment of the invention.

FIG. 1 shows a perspective view of one embodiment of a computer cart 10 designed to maintain a large number of portable computing devices. In the view of FIG. 1, the doors of the computer cart are closed to show how the cart appears when in a locked condition. The exterior of the cart may be of arbitrary design and the invention is not limited to a cart having the particular aesthetic appearance of the cart shown in FIG. 1.

In general, the computer cart shown in FIG. 1 has an exterior sheathing which may be vented as appropriate to enable heat generated by charging computers to be released from the cart. The exterior of the cart generally protects the computers from being accessed while being stored within the cart. The cart also has wheels 12 to enable the cart to be mobile. The wheels may be implemented as castors which may be directionally locking and/or motion locking depending on the particular embodiment. Doors 14 on the front of the cart allow access to an interior storage compartment where the portable computing devices are stored in the cart. The doors may be locked to prevent unauthorized access to the portable computing devices stored therein.

Figure 2:
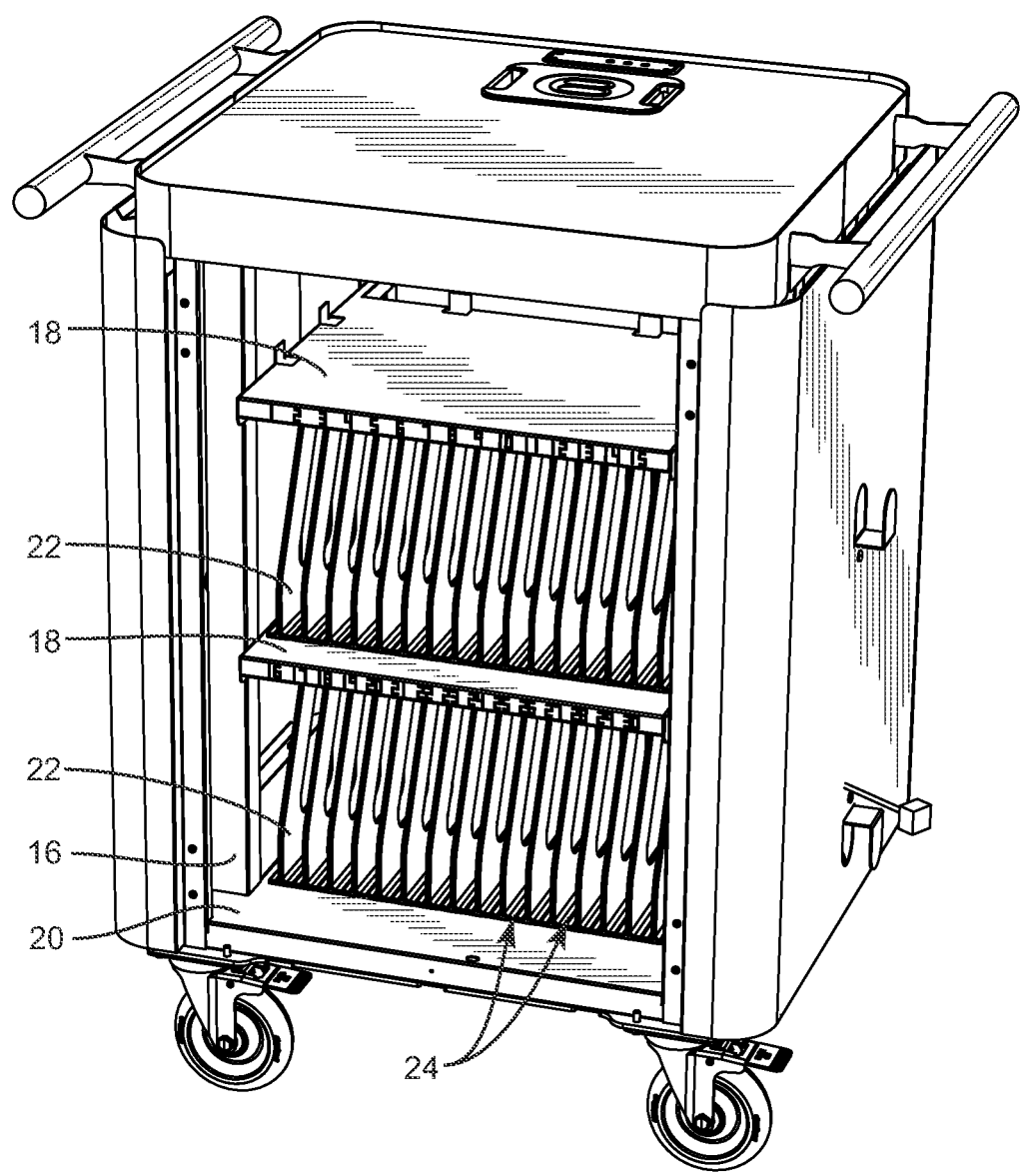
FIG. 2 is a front perspective view of the computer cart of FIG. 1 with the doors removed to show an interior of the computer cart.

FIG. 2 shows the cart of FIG. 1 with the doors 14 removed to reveal the interior of the cart. In the embodiment shown in FIG. 2, the computer cart 10 generally is formed as a cabinet having an interior framing structure 16 which is used to support shelves 18. The exterior sheathing of the computer cart is also attached to the interior framing structure 16. A floor 20 forms a bottom of the computer cart 10. Dividers 22 are provided to separate the interior of the cart into individual storage compartments 24 sized to hold the portable computing devices.

Figure 8:
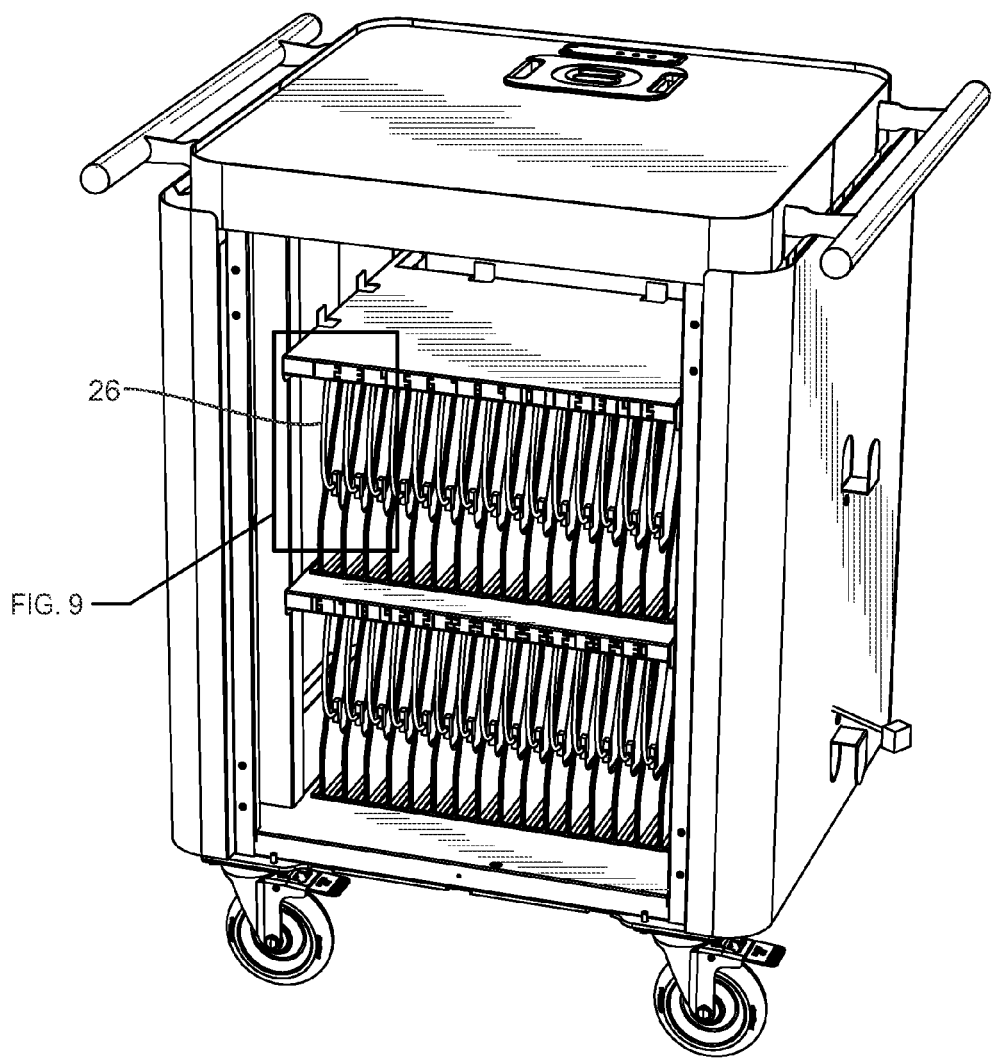
FIG. 8 is a front perspective view of the computer cart of FIG. 1 with the doors removed to show an interior of the computer cart with electrical connectors installed.
Figure 9:
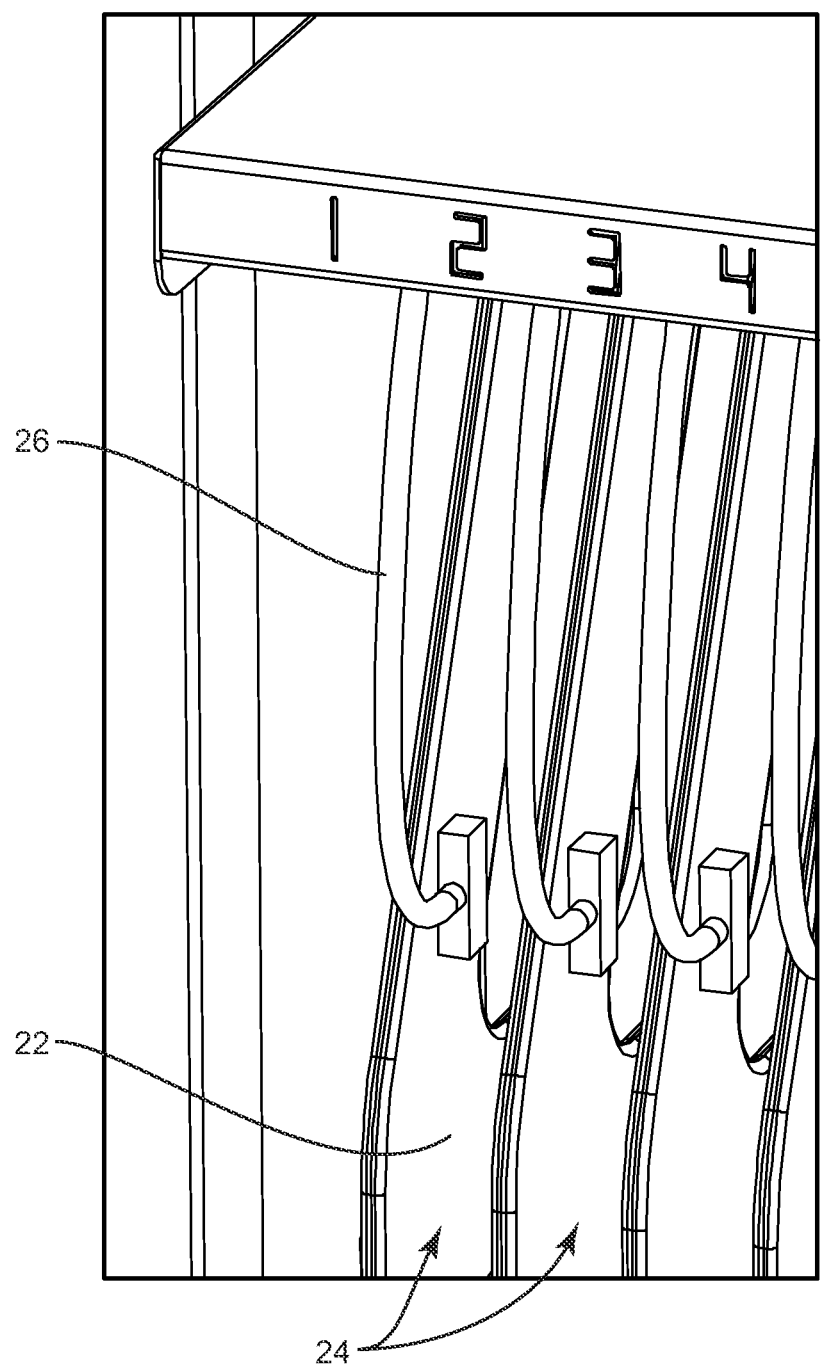
FIG. 9 shows an expanded view of a few of the electrical connectors, associated compartments, and compartment numbering system.

As shown in FIGS. 2 and 8-9, the computer compartments are formed within the cart by dividers 22. A compartment, thus, is defined by a pair of dividers which physically separate the compartment from an adjacent storage area so that the portable computing device is able to be held vertically within the cart. Each compartment is designed to hold a single portable computer such as a laptop computer, tablet computer, or iPad™. FIG. 8 shows a perspective view of the computer cart of FIG. 1 with electrical connectors 26 provided in each of the compartments 24. FIG. 9 shows an enlarged perspective view of some of the compartments. As shown in FIGS. 2 and 8, the individual compartments are included within the cart on multiple shelves which enable two rows of portable computing devices to be stored within the computer cart. In other embodiments the compartments may be arranged in different ways to enable other numbers of portable computer devices to be stored within the computer cart.

As shown in FIGS. 8-9, an electrical connector 26 is fed through into each compartment to be accessible at the front of each compartment. Having the electrical connector accessible within each compartment makes it easy for a person to detach a portable computing device from the cart when removing the portable computing device from the cart, and to then re-attach the portable computing device to the electrical connector when returning the portable computing device to the cart. The electrical connector provides power to the portable computing device to enable the portable computing device to be charged while stored within the computer cart. Optionally, depending on the particular type of portable computing device, the electrical connector may also enable data access to the portable computing device. For example, the computers may be synchronized while being stored within the computer cart.

To enable the computer cart to be used with multiple types of portable computing devices, the electrical connectors are often installed into the computer cart only after the end user's requirements have been specified. Frequently this requires the electrical connectors to be installed in an inconvenient location, such as at the customer's site rather than at the factory where the cart was manufactured. Since a given cart may hold 30 or more computers, installing these electrical connectors into the cart and then securing the associated electrical adapters can take a significant amount of time. Particularly where the cart is largely enclosed to minimize opportunity for unauthorized access to the interior of the cart, installation of electrical connectors may require the person doing the installation to bend down and even crawl into the interior of the computer cart.

According to an embodiment, as described in greater detail below, rather than individually installing the electrical connectors into the interior of the computer cart, the electrical connectors are installed into an electrical connector management system outside of the cart, and then installed as a group into the cart. This makes it easier to install the electrical connectors when the electrical connectors are first installed in the cart, or if it is necessary to replace one or more of the electrical connectors. Specifically, since the electrical connector management structure may be removed from the computer cart, installation of the electrical connectors may be performed at a convenient location such as on the top surface of the cart. Installing the wires on a workbench or on the top surface of the cart allows the person installing the wires to be sitting or standing, which are much more comfortable positions than crouching or kneeling and bending into the cart, as was previously required to install the electrical connectors into the cart. Hence, providing a removable electrical connector management system provides a convenient way to install groups of electrical connectors to simplify wiring of the cart and reduce the amount of time it takes to install the electrical connectors into the cart.

FIGS. 3-7 show an embodiment of a removable electrical connector management system 28 and how the electrical connector management system may be used to enable electrical connectors to be installed into the computer cart 10. As shown in FIGS. 8-9, in one embodiment the removable electrical connector management system 28 is implemented on the underside of shelves 18. The invention is not limited in this manner, however, as the removable electrical connector management system may be implemented in other removable components of the computer cart as well.

In the embodiment shown in FIGS. 3-7, the removable electrical connector management system is implemented within a removable shelf 18. The shelf may be installed into the computer cart using thumb screws to enable the cart to be secured to the interior framing structure 16 of the computer cart 10. Alternatively, metal tabs 41 (see FIG. 15) extending from an interior surface of vertical members of frame 16 may be inserted into slots 30 on the edge of the shelf to enable the shelf to be supported at a particular vertical position within the computer cart. Other ways of mounting the removable shelf within the cart may be used as well.

Figure 6:
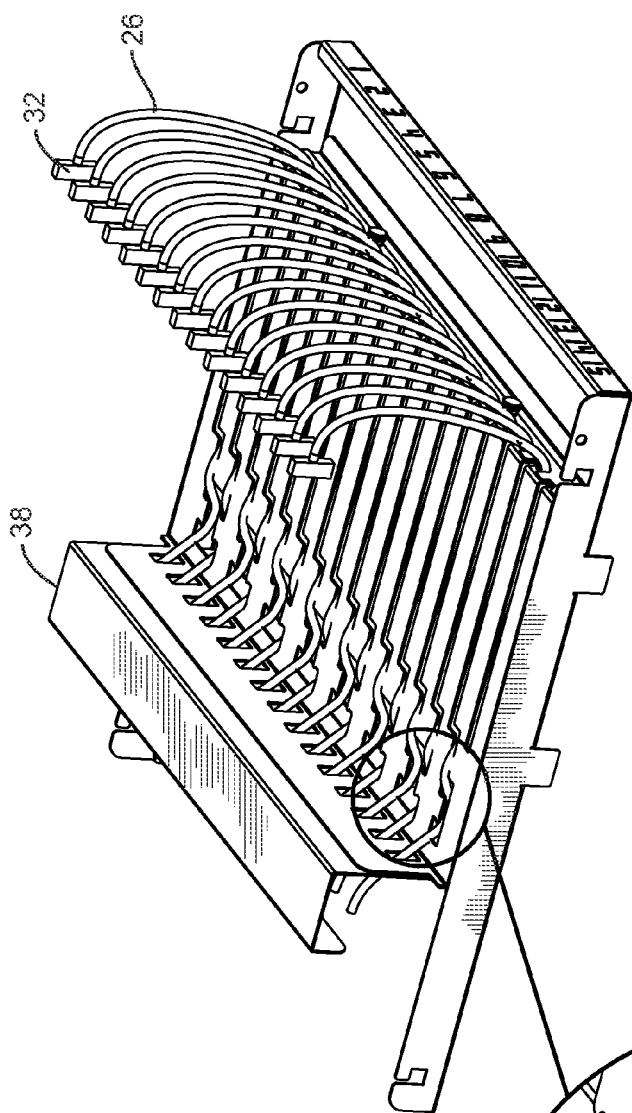
FIGS. 6-7 show views of the structure shown in FIG. 3 with electrical connectors inserted into the electrical connector management system.
Figure 7:
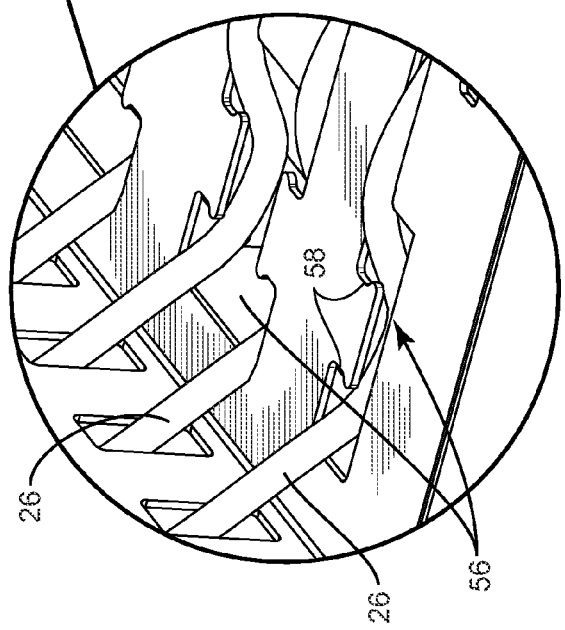

In operation, to install electrical components into the cart, the removable structure (e.g. the shelf 18 in the illustrated embodiment) containing the electrical connector management system 28 first will be removed from the computer cart 10. FIG. 3 shows an embodiment of the electrical connector management system in the shelf while the shelf 18 is removed from the computer cart. Electrical connectors are then inserted into the electrical connector management system as shown in FIGS. 6-7. Once all of the desired electrical connectors have been installed into the removable electrical connector management system, the structure containing the electrical connector management system can then be reinserted into the computer cart. FIGS. 8-9 show views of the resultant computer cart with the electrical connectors installed. Enabling the electrical connectors to be installed into a removable structure, and then inserted into the computer cart as a group, greatly reduces the amount of time it takes to wire the computer cart since the technician is not required to individually pull electrical connectors into each of the compartments and individually secure the electrical connector within the compartments. Further, installation is less physically demanding since the electrical connectors can be inserted into the wire management system while the wire management system is on the top of the cart, work bench, or other convenient location.

FIGS. 3-7 show an embodiment of the removable electrical connector management system in greater detail. To make it easy for a person to manipulate the electrical connector and plug in/unplug the computer, it is desirable to have plugs 32 at the ends of electrical connectors 26 accessible at the front of the compartments (see FIG. 8). However, the other ends of the electrical connectors 26 are required to interconnect with electrical components at the rear of the cart 10. Accordingly, the electrical connector management system thus is designed to extend from a front 34 of shelf 18 to a rear 36 of shelf 18. An electrical adapter storage area 38 may optionally be provided at the rear 36 of the shelf 18.

In the embodiment shown in FIGS. 3-7, the electrical connector management system includes a plurality of slots 40 extending from the front of the shelf toward the rear of the shelf. The electrical connectors 26 can be pushed into the slots and secured at the front of the shelf with a electrical connector retention bracket 42.

Figure 5:
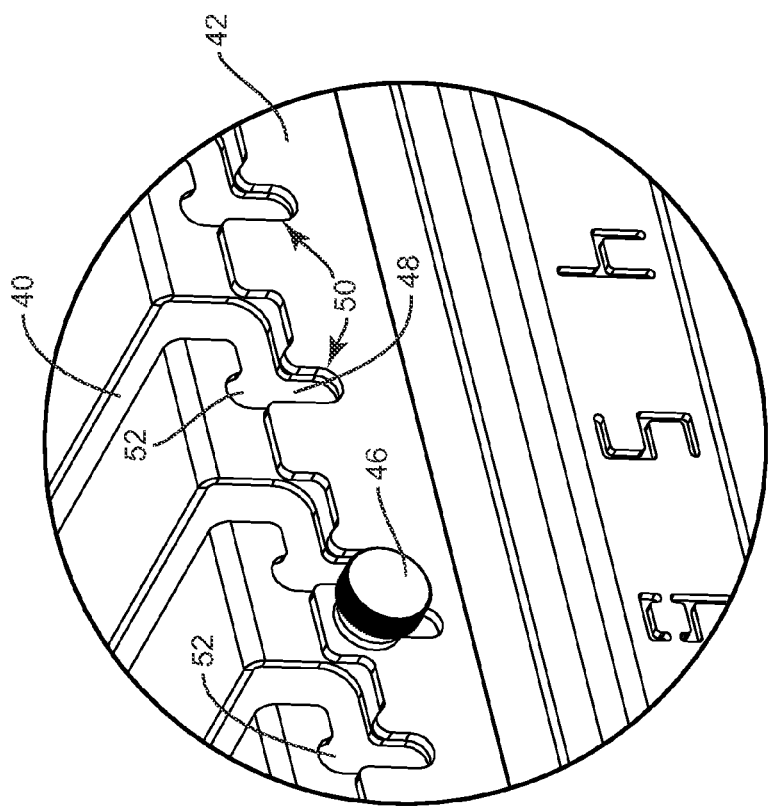
FIG. 5 is an expanded view of the structure shown in FIG. 3 showing an electrical connector retention bracket in an open position.
Figure 4:
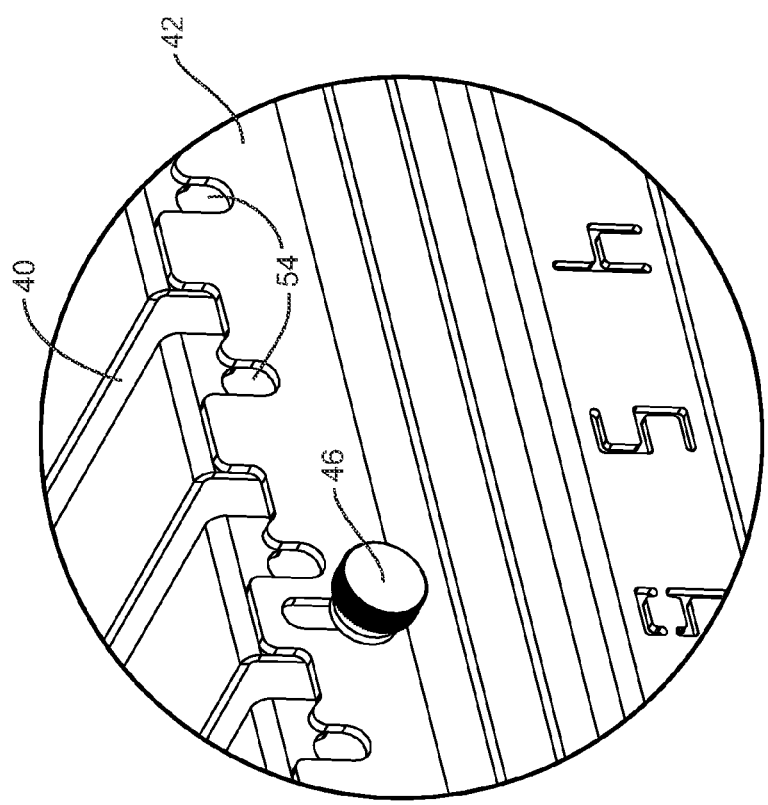
FIG. 4 is an expanded view of the structure shown in FIG. 3 showing an electrical connector retention bracket in a closed position.

FIGS. 4-5 show the electrical connector retention bracket 42 in greater detail. FIG. 4 shows the electrical connector retention bracket 42 in a closed position and FIG. 5 shows the electrical connector retention bracket 42 in an open position. As shown in FIGS. 4-5, the electrical connector retention bracket 42 is movable to enable a variable amount of a front portion 44 of the slot 42 to be exposed.

In the embodiment shown in FIGS. 4-5, the front portion 44 of the slot 40 is J-shaped. To enable electrical connectors to be inserted into the electrical connector management system, the electrical connector retention bracket is moved from the closed position shown in FIG. 4 to the open position shown in FIG. 5. In the illustrated embodiment this may be accomplished by unscrewing thumbscrew 46 and sliding the electrical connector retention bracket 42 down relative to the supporting structure. When the J-shaped front portions 44 of the slots 40 are exposed, the electrical connectors may be pushed into the slots 40 and moved horizontally toward a distal end 48 of the J-shaped front portion 44. The J-shaped front portion and electrical connector retention bracket each have a recessed area 50 designed to hold the electrical connectors while the electrical connector retention bracket is in the open position, as shown in FIG. 5. The recessed area 50 enables multiple electrical connectors to be inserted into respective slots 40 and held in position until the electrical connector retention bracket is able to be secured to lock the electrical connectors in place.

Once all of the desired electrical connectors have been inserted into a respective slot 40, the electrical connector retention bracket is moved vertically as shown in FIG. 4 to lock each of the electrical connectors in place (see FIG. 6). The electrical connectors will remain in the recessed area of the electrical connector retention bracket while the electrical connector retention bracket is moved to the locking position so that it is easy to secure the electrical connectors as a group. The J-shaped portion 44 of the slot 40 has a notch 52 on a top edge that mirrors the bottom of the recessed area 50 to create an opening 54 through which the electrical connector will extend when the retention bracket is in the closed position. Optionally, the dimensions of the opening 54 may be sized to enable the casing of the electrical connector to be engaged by the opening 54 and recessed area 50 when the electrical connector retention bracket is in the locked position to grip a casing of the electrical connector. This allows the retention bracket to grip the casing of the electrical connector to resist longitudinal movement of the electrical connector relative to the electrical connector management system. This helps prevent a person from pulling the electrical connector out of the electrical cart when accessing the computers stored therein.

The geometry of the retention bracket is such that it is designed to at least partially overlap the J-shaped slot while in the closed position to prevent the electrical connector from being removed from the slot. For example, FIG. 4 shows the retention bracket 42 overlapping a section of the front portion 44 of the slot 40 which would prevent an electrical connector secured in opening 54 from being moved longitudinally along the J-shaped portion of the slot.

At the rear edge of the shelf the slots 40 have an angled bend. By causing the slots to include an angled bend, when a electrical connector is pushed into the slot and pulled taut, the electrical connector will extend through the shelf next to the slot so that it is supported along the length of the shelf next to the open slot 40. To keep the electrical connector taut within the shelf, an electrical connector engagement section 56 is provided. In one example, as shown in FIG. 7, each electrical connector engagement section 56 is formed as a C-shaped cut-out that includes a pair of indents 58 sized to grip the casing of electrical connector 32.

To install electrical connectors into the electrical connection management system, the electrical connectors are pushed into slots 40 and into the open J-shaped areas exposed by moving the electrical connector retention bracket to the position shown in FIG. 5. Once all the electrical connectors are at the desired position, i.e. each has the same length of electrical connector extending out beyond the front edge of shelf 18, the electrical connector retention bracket will be moved into the position shown in FIG. 4 to secure the front ends of the electrical connectors. The electrical connectors are pressed into the slots 40 and angled bends 54. Preferably the length of each angled bend corresponds to the length of each of the corresponding J-shaped sections so that the electrical connectors extend approximately parallel to the slots 40.

A loop of each of the electrical connectors is then pushed into C-shaped cut-out 56 and pulled taut to cause the indents 58 to engage the casing of the electrical connector. This will secure the electrical connector in a relatively taut manner within the electrical connector management system to prevent the electrical connectors from coming loose while the removable structure containing the electrical connector management system is inserted into the computer cart.

As shown in FIGS. 6-7, the electrical connectors extend through apertures 60 in the electrical adapter storage area 38. The electrical adapter storage area is included, in this embodiment, to enable the electrical adapters to be installed along with the electrical connectors while the electrical connector management system is outside of the computer cart. For example, electrical adapters and excess wiring may be placed on the shelf and secured using wiring ties. If electrical adapters are not required, because of the particular manner in which the portable computers are implemented, then the electrical adapter storage area may optionally be omitted.

Figure 11:
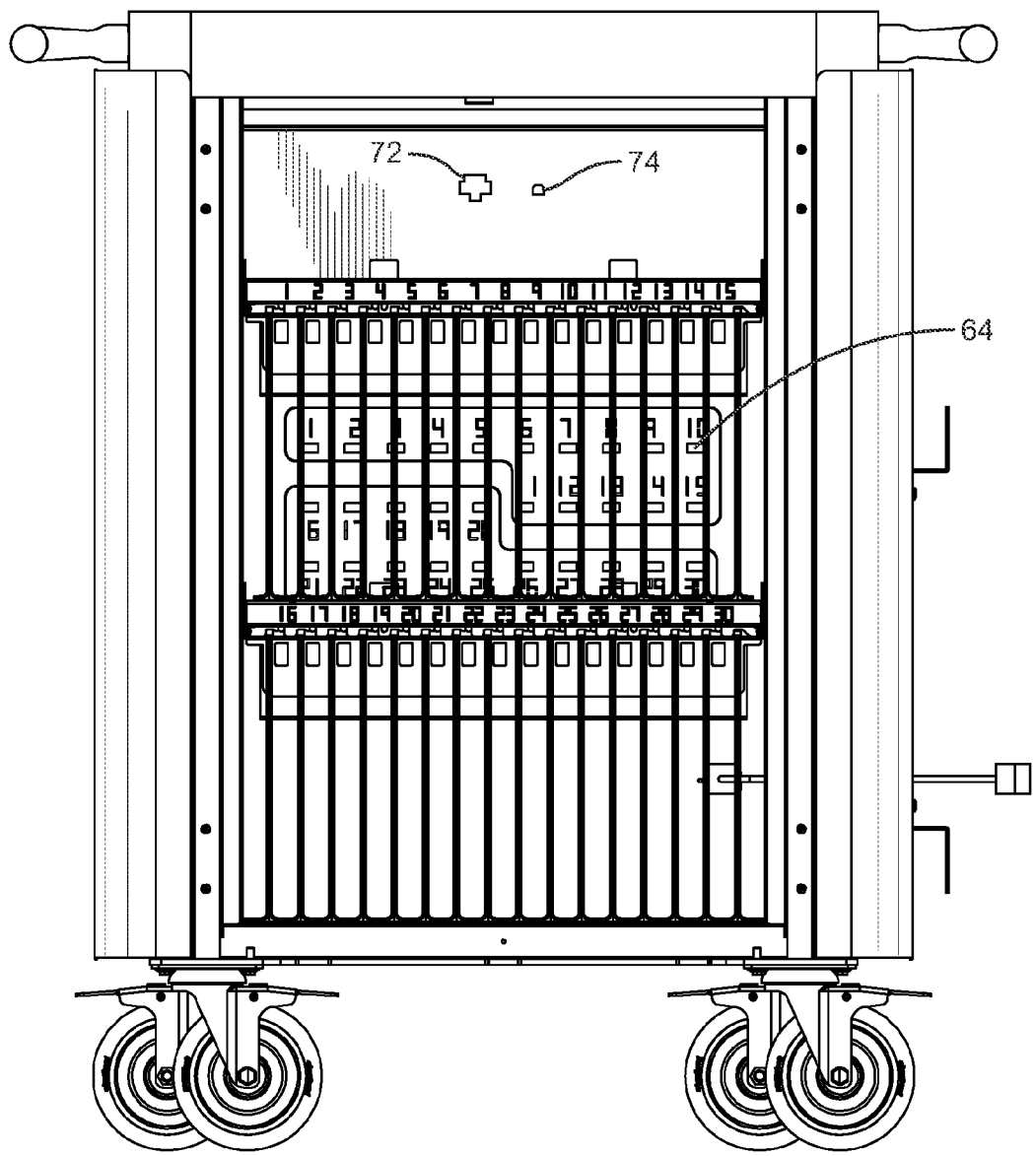
FIG. 11 is an interior view of the computer cart showing the numbering system on each of the computer compartments as well as numbered USB ports on a USB panel situated in a rear portion of the computer cart.
Figure 12:
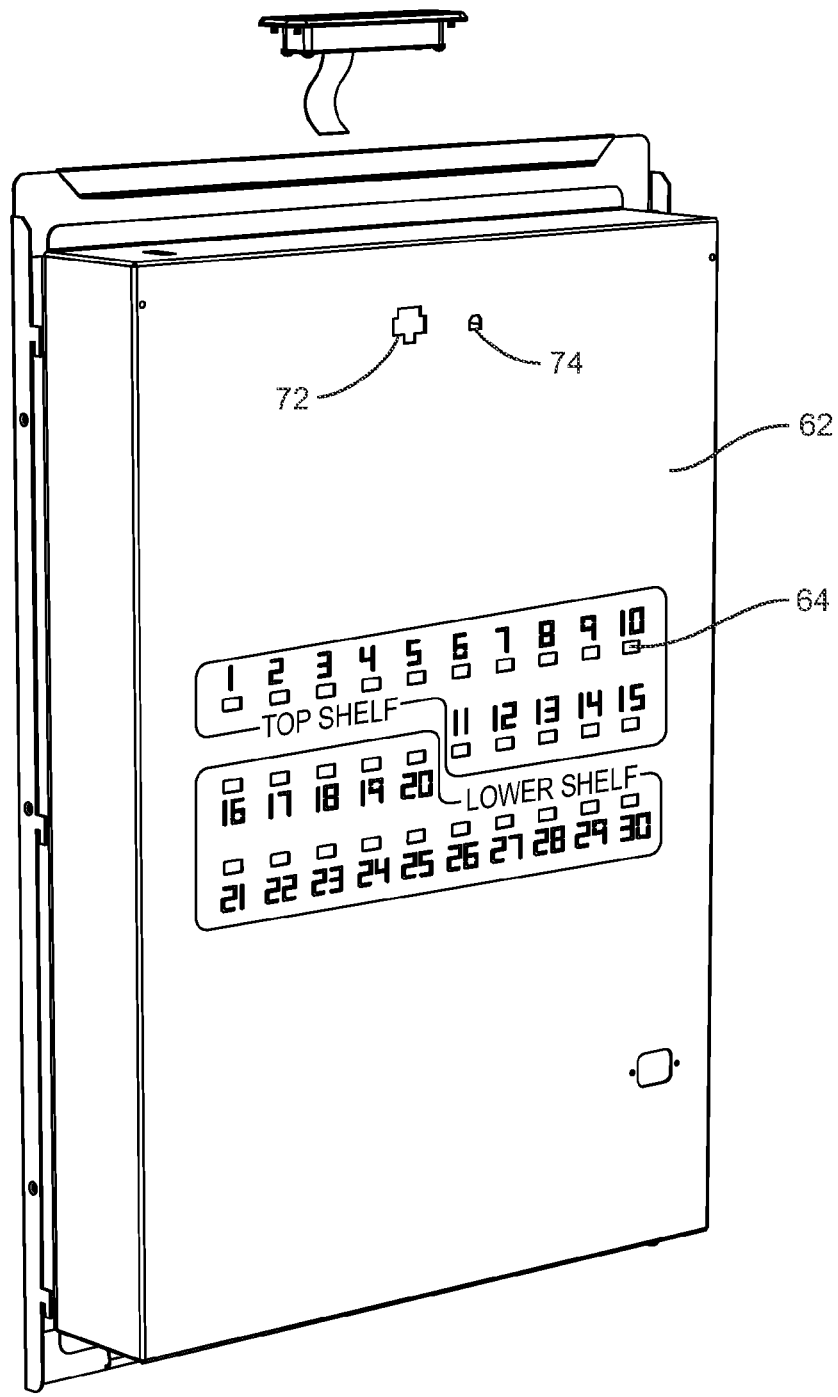
FIG. 12 is a front perspective view of the USB panel.
Figure 15:
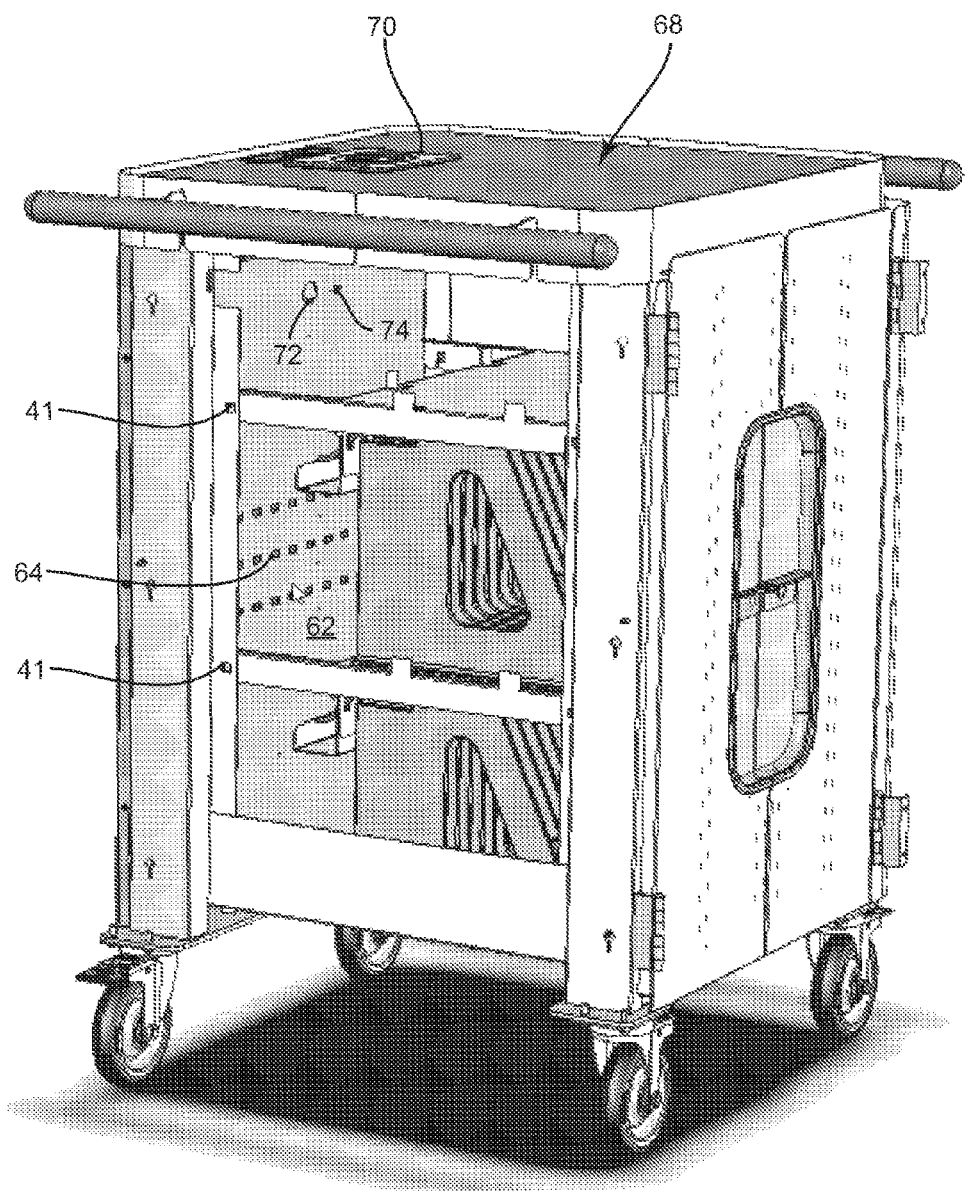
FIG. 15 is a perspective cut-away view of the computer cart showing the compartments and USB ports on the USB panel.

Some portable computers are designed to be charged by being connected to a Universal Serial Bus (USB) cable and do not require a separate electrical adapter. In one embodiment, the computer cart 10 includes a USB panel 62 along a rear wall of the cart 10. The USB panel 62 includes multiple USB ports 64 which are numbered to correspond to the compartments, as shown in FIGS. 11, 12, and 15. To enable the USB panel 62 on the interior of the cart to be accessed, an arm hole 66 is formed on the top surface 68 of cart 10. The arm hole 66 may be covered by a plate 70 which is removable to allow access to the USB ports within cart 10.

One example of a USB hub that may be utilized to implement the USB panel 62 is described in greater detail in U.S. patent application Ser. No. 13/017,098, entitled High Current Multi-Port USB Hub, filed Jan. 31, 2011, the content of which is hereby incorporated herein by reference. In this application, a USB hub containing 10 high current USB ports is described. To implement a 30 port USB hub three similarly configured USB hubs may be serially connected to provide 30 high current (2.1 Amp 5V DC) USB ports on cart 10.

Once the electrical connectors have been installed into the removable electrical connector management system and the electrical connector management system has been installed into the computer cart, the plate 70 will be removed and the electrical connectors may be plugged into the USB ports 64 in the USB panel 62. The plate 70 may then be replaced to provide a contiguous flat surface to the top of cart 10. Optionally the plate may not be identically sized with the arm-hole to allow cables to extend through the arm hole to access an accessory electrical outlet 72 and master USB port 74.

In one embodiment, each compartment 24 within the computer cart 10 is numbered as shown, for example, in FIG. 11. The numbers in one embodiment are laser cut into an edge of the shelf 18 and enable each individual computer storage compartment to be uniquely identified and referenced within the computer cart.

The USB panel 62 likewise includes individual USB ports 64 which are numbered with corresponding numbers. When connecting the computer electrical connectors, the person performing the installation will plug the electrical connector associated with compartment number 1 into USB port number 1. The electrical connector for compartment number 2 will be plugged into USB port numbered 2. This process iterates for each compartment. By numbering the USB ports and having a correspondence between the numbered USB ports and compartments, it is possible to individually identify each of the computers stored within the computer cart. This facilitates maintenance of the individual devices as well as makes it easy to identify particular computers within the cart.

Figure 10:
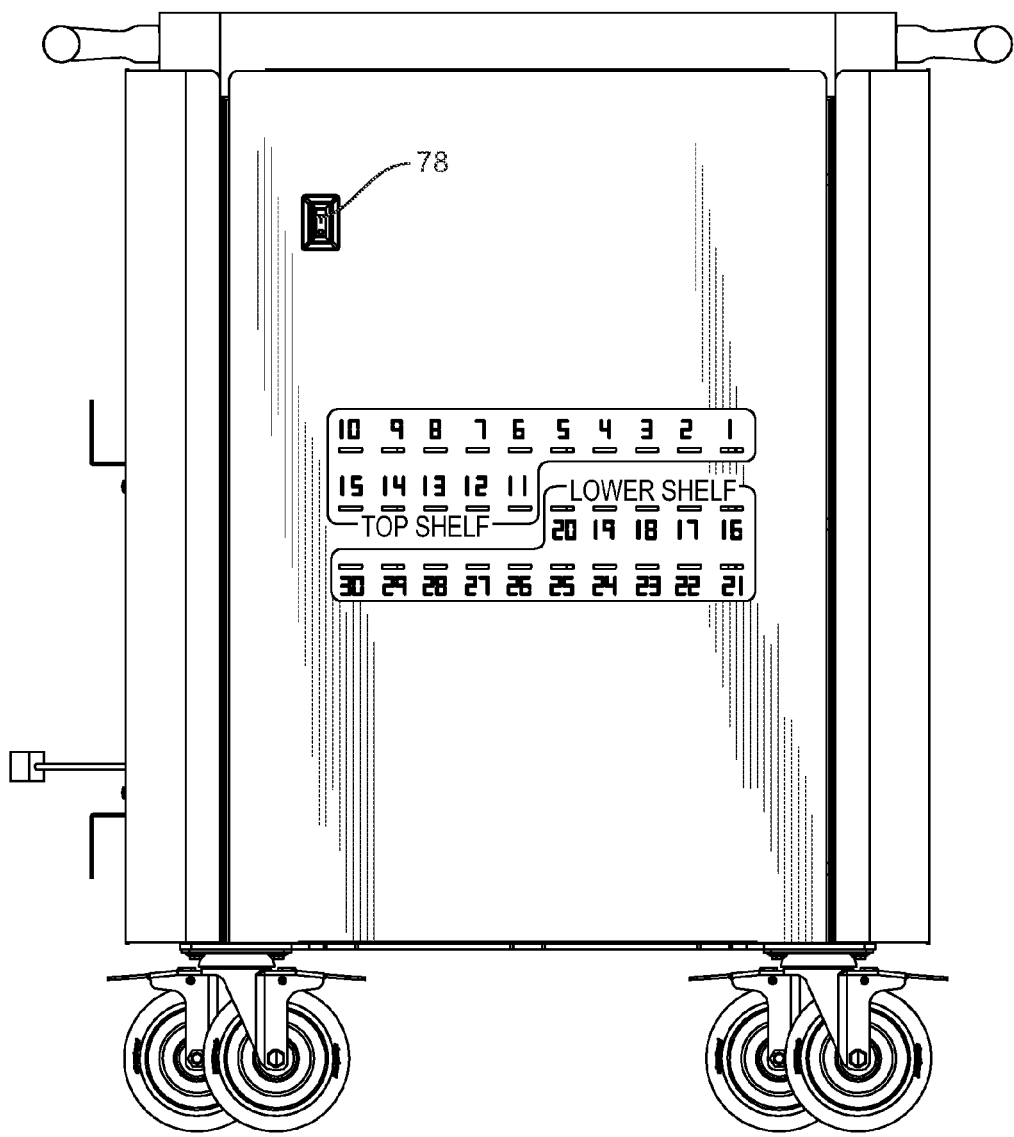
FIG. 10 is a view of a rear panel of the computer cart showing numbered LED status indicators corresponding to each compartment inside the computer cart.
Figure 13:
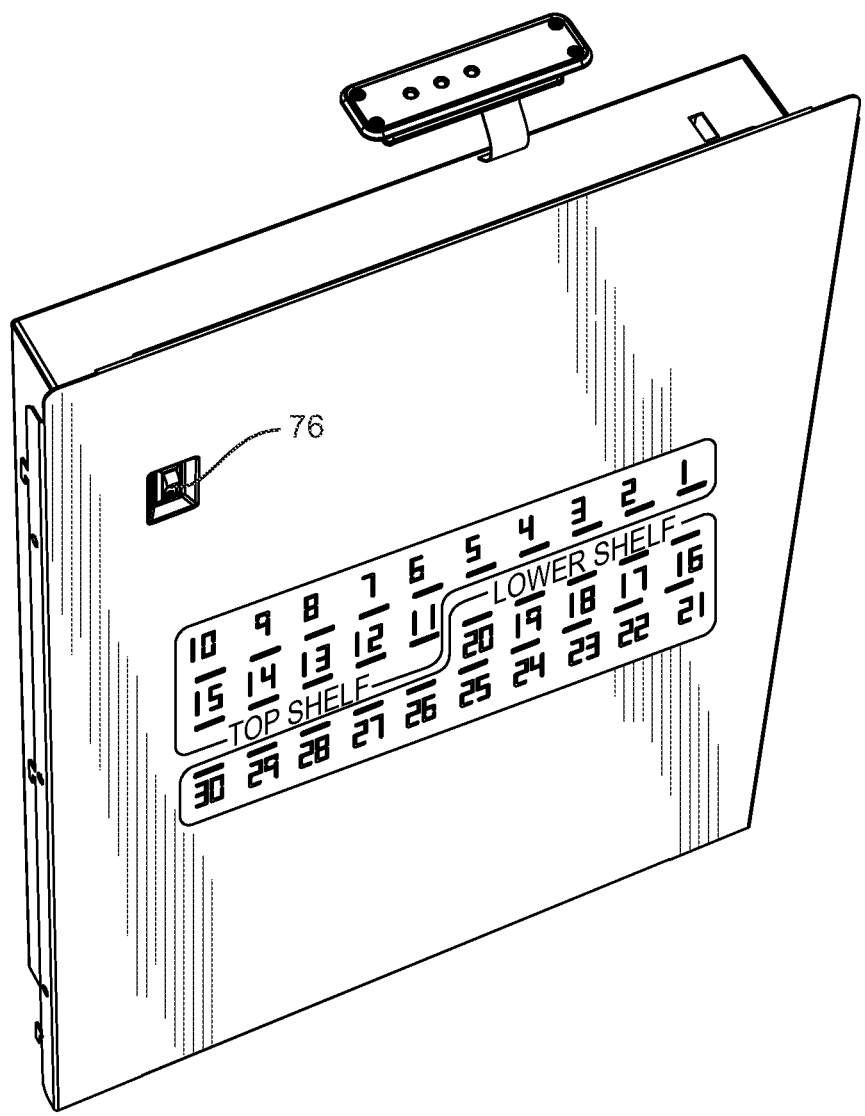
FIG. 13 is a rear perspective view of the USB panel.
Figure 14:
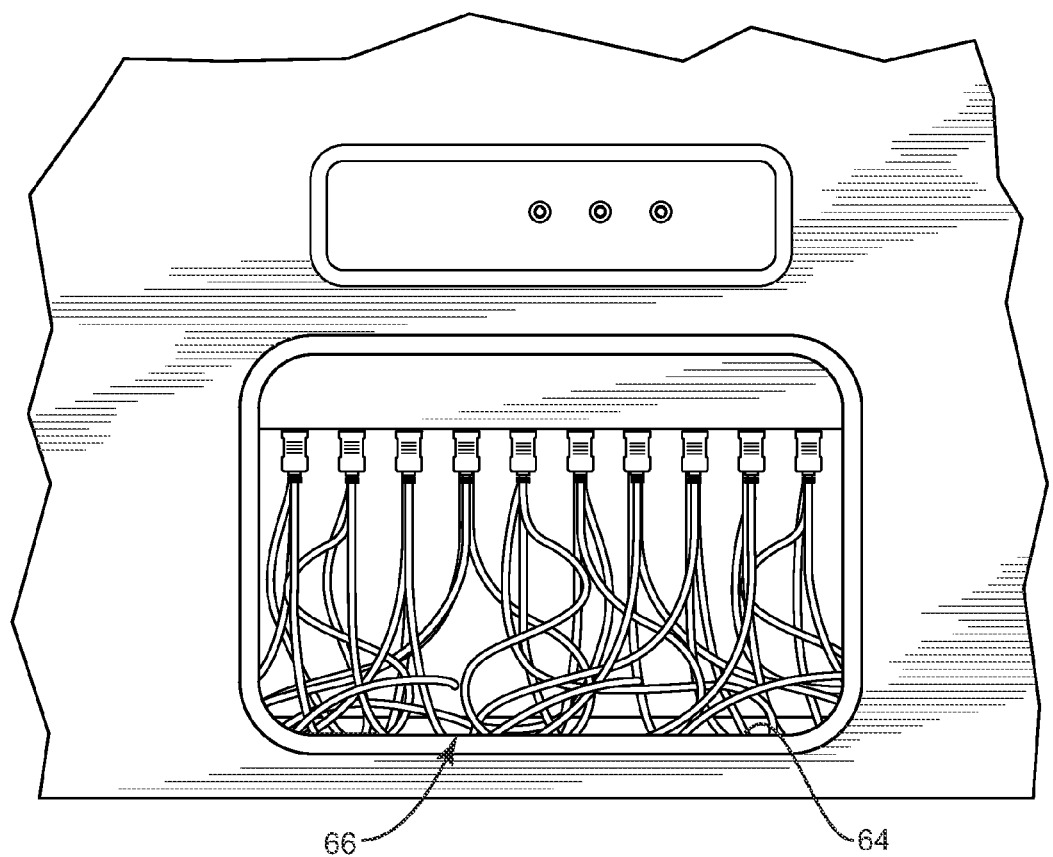
FIG. 14 is a top view of a portion of the top surface of the computer cart showing an arm hole access to USB cables connected to the USB panel.

FIGS. 10 and 13 show a rear status panel. As shown in FIGS. 10 and 13, the status panel has a status indicator 76 for each compartment contained within the computer cart. The status indicator may be implemented using multi-color LEDs that will enable the operator to determine whether the computer stored in the bay has been properly connected to the cart, the charge status of the computer, and optionally other status of the computer. For example, the status indicators may glow amber when a computer is connected to the cart or to indicate that the computer is charging and turn green when fully charged. By numbering the status indicators, and having correspondence between the status indicators on the rear of the cart and the compartments within the cart, it is easy to select those computers that have been fully charged when selecting computers to be removed from the cart for use. Likewise, it is easy to verify that all computers have been returned and are properly connected to the cart.

As shown in FIGS. 10 and 13, the status indicators are numbered using a corresponding numbering system. Additionally, where there are multiple shelves, the status indicators associated with the different shelves may be indicated so that it is easy to determine the shelf on which a particular computer is located. By numbering the bay, the USB port corresponding to the bay, and the status indicator, it is possible to keep track of each of the computers within the cart so that the individual status of each computer may be monitored quickly and easily.

Likewise, when the status indicator indicates that there is a problem with one of the computers, the numbering system enables the problem to be quickly isolated and resolved. For example, assume that one of the computers has not been connected to the electrical connector when it was returned to the cart. The status indicator of the particular computer will show the status of that computer as "unplugged". Since the status indicator is numbered, it is easy to access the computer storage area at the front of the cart, locate the bay with the corresponding number, and determine if the computer has been properly connected to the power electrical connector. If the computer is properly connected, the corresponding USB connector may likewise be accessed to determine if the electrical connector is properly connected to the USB connecter on the USB panel within the computer cart. Utilizing the numbering system greatly simplifies trouble-shooting to determine why a computer is not properly being charged while stored within the computer cart.

In one embodiment, the computer cart is configured to enable all portable computers stored within the computer cart to be synchronized with a master computer connected to the computer cart. For example, the master computer may be placed on the top 68 of the laptop cart 10 and connected to the auxiliary power outlet 72 and USB port 74 accessible through arm-hole covered by plate 70. Alternatively, in the illustrated embodiment, there is room within the cart for the master laptop computer to be stored on the top shelf 18 and connected to auxiliary power outlet 72 and USB port 74. Each of the other computers is then configured to be synchronized with the master computer. Once the content that is to be synchronized is organized, the synchronization process may be activated to cause each of the portable computers stored within the computer cart to be synchronized with the master computer.

One way for multiple portable computers to be synchronized with a master computer is to use iTunes™ Apple, Inc. software to synchronize content to the multiple computers. In this example, the content to be synchronized is loaded and organized within the iTunes™ software package, e.g. by causing the content to be organized into a playlist. The computers to be synchronized are inserted into the cart and connected to the electrical connectors. The master computer should be ON, with no applications running. The cart should be plugged into the wall outlet, but should have the master power switch 78 (see FIG. 10) turned off.

With the cart and master computers in this state, a USB cable is used to connect the master computer to the USB port 68 on computer cart. The main power switch 78 to the computer cart is then switched to the ON position. Once the power to the cart has been restored, iTunes™ should be started on the master computer. Once iTunes™ launches, it will recognize each of the portable computers connected to the computer cart. As each portable computer is recognized by the iTunes™ software on the master computer it will be synchronized with the master computer. Once the synchronization process has been completed, the individual portable computers may be ejected individually or the iTunes™ software may be closed on the master computer to cause all devices to be ejected at once.

Some devices, such as the current version of the iPad™ tablet computer available from Apple, Inc., will not synchronize and charge at the same time. For these devices, once the synchronization process has been completed, the USB cable connecting the master computer to the computer cart should be disconnected so that the iPad™ devices may be charged while stored in the computer cart.

Occasionally iTunes™ may automatically check for new software updates, including available updates for iTunes™ itself and any attached iPads™. This feature may interfere with synchronizing multiple iPads™ and, hence, should be administratively disabled prior to synchronizing the master computer with iPads™ stored within the computer cart.

It should be understood that various changes and modifications of the embodiments shown in the drawings and described in the specification may be made within the spirit and scope of the present invention. Accordingly, it is intended that all matter contained in the above description and shown in the accompanying drawings be interpreted in an illustrative and not in a limiting sense. The invention is limited only as defined in the following claims and the equivalents thereto.

What is claimed is:

1. A computer cart, comprising:
a frame; and
at least one removable structure, the removable structure being attachable to the frame while contained within the computer cart and being detachable from the frame to enable the removable structure to be removed from the computer cart, the removable structure having formed thereon an electrical connector management system designed to retain a plurality of electrical connectors prior to and during installation of the electrical connectors into the computer cart;
wherein the computer cart includes a plurality of vertical computer compartments, each computer compartment being designed to hold a single portable computer in a vertical orientation;
wherein the at least one removable structure, when contained within the computer cart, attaches to the frame to extend above the plurality of vertical computer compartments and contains electrical connector retention slots corresponding with the vertical computer compartments; and
wherein the electrical connector management system is contained on a lower surface of the removable structure when the removable structure is contained within the computer cart.

2. The computer cart of claim 1, further comprising a pair of indents to grip a casing of an electrical connector while the electrical connector is disposed in the electrical connector management system to prevent movement of the electrical connector relative to the electrical connector management system.

3. The computer cart of claim 1, further comprising a top surface, the top surface having an arm-hole formed therein, the arm-hole being sized to enable an operator to reach down through the top surface into an interior of the computer cart.

4. The computer cart of claim 3, further comprising a removable plate at least partially covering the arm-hole.

5. A computer cart, comprising:
a frame; and
at least one removable structure, the removable structure being attachable to the frame while contained within the computer cart and being detachable from the frame to enable the removable structure to be removed from the computer cart, the removable structure having formed thereon an electrical connector management system designed to retain a plurality of electrical connectors prior to and during installation of the electrical connectors into the computer cart;
wherein the electrical connector management system includes a plurality of slots to receive respective electrical connectors; and
wherein each of the plurality of slots has a J-shaped front portion, the J-shaped front portion defining a curving channel having a top edge and a bottom edge, and a recessed area in the top edge.

6. The computer cart of claim 5, further comprising an electrical connector retention bracket movably connected to the removable structure, the electrical connector retention bracket being shaped to allow the electrical connectors to be moved along the J-shaped front portion while the electrical connector retention bracket is disposed in a first position, the electrical connector retention bracket being further shaped to at least partially overlap the J-shaped front portion to prevent movement of the electrical connectors along the J-shaped front portion while the electrical connector retention bracket disposed in a second position.

7. The computer cart of claim 6, wherein the electrical connector retention bracket at least partially engages the electrical connectors while in the second position to prevent longitudinal movement of the electrical connectors relative to the electrical connector management system.

8. A computer cart, comprising:
a frame; and
at least one removable structure, the removable structure being attachable to the frame while contained within the computer cart and being detachable from the frame to enable the removable structure to be removed from the computer cart, the removable structure having formed thereon an electrical connector management system designed to retain a plurality of electrical connectors prior to and during installation of the electrical connectors into the computer cart;
wherein each of the plurality of slots has a J-shaped front portion; and
wherein each of the plurality of the slots has an L-shaped bend at a rear section, the L-shaped bend having a length approximately equal to a length of the J-shaped front portion so that when one of the electrical connectors is disposed within the electrical connector management system between the J-shaped front portion and the L-shaped bend the electrical connector extends approximately parallel to the slot.

* * * * *